(12) United States Patent
Shiikuma et al.

(10) Patent No.: US 6,792,050 B1
(45) Date of Patent: Sep. 14, 2004

(54) ASK MODULATION APPARATUS AND METHOD

(75) Inventors: Kazumi Shiikuma, Tokyo (JP); Toyosaka Yamasaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/361,205

(22) Filed: Jul. 27, 1999

(30) Foreign Application Priority Data

Jul. 30, 1998  (JP) ............................................. 10-215516

(51) Int. Cl.$^7$ ............................. H03C 1/52; H04L 27/04
(52) U.S. Cl. ........................ 375/300; 375/268; 332/149
(58) Field of Search .................................. 375/268, 300, 375/285; 332/149, 100, 163, 148, 155; 455/108

(56) References Cited

U.S. PATENT DOCUMENTS

| | | | |
|---|---|---|---|
| 3,794,920 A | | 2/1974 | Darrow |
| 3,906,349 A | | 9/1975 | Harrison |
| 3,961,287 A | * | 6/1976 | Cacciola et al. ............ 332/162 |
| 4,602,226 A | * | 7/1986 | Vatis ........................... 332/149 |
| 5,239,275 A | * | 8/1993 | Leitch ......................... 332/152 |
| 5,491,367 A | * | 2/1996 | Schinzel ..................... 307/106 |
| 5,798,674 A | * | 8/1998 | Fountain ..................... 375/300 |
| 5,841,821 A | * | 11/1998 | Doyle et al. ................. 375/350 |
| 6,014,409 A | * | 1/2000 | Curtis ......................... 375/257 |
| 6,075,414 A | * | 6/2000 | Nagaoka et al. ............ 330/145 |
| 6,608,536 B2 | * | 8/2003 | Fallahi ........................ 333/168 |

FOREIGN PATENT DOCUMENTS

| | | |
|---|---|---|
| JP | 58-104531 | 6/1983 |
| JP | 2-20942 | 1/1990 |
| JP | 2-223256 | 9/1990 |
| JP | 4-167645 | 6/1992 |

OTHER PUBLICATIONS

Horowitz et. al., "The Art of Electronics", published in 1980, pp. 232.*

* cited by examiner

Primary Examiner—Phuong Phu
(74) Attorney, Agent, or Firm—McGinn & Gibb, PLLC

(57) ABSTRACT

A base band signal is frequency limited by a band limiting circuit 1. The waveform of this output signal rises and falls smoothly against a time axis. A driving circuit 2 functions as a buffer amplifier with voltage gain of 1 between the band limiting circuit 1 and ASK modulation circuit 3, and the output voltage wave is equal to the output waveform of the band limiting circuit 1. The ASK modulation circuit 3 turns on/off a field effect transistor 61 by the output signal voltage from the driving circuit 2, thereby discontinuing the carrier of the microwave band to be externally entered and performing ASK modulation (binary ASK), and provides a desired ASK modulated waveform as a result.

23 Claims, 16 Drawing Sheets

ASK MODULATION APPARATUS AND METHOD

BACKGROUND OF THE INVENTION

The present invention relates to an ASK (Amplitude Shift Keying) modulation apparatus, particularly to an ASK modulation apparatus and method for a mobile terminal used for a microwave band with reduced unintended radiation and improved on/off ratio.

Recently, in the data communication system which uses a microwave band radio signal for duplex high speed data communication between a master station and a plurality of small mobile terminal, particularly, because of small size and low power consumption, a binary ASK modulation system is used as a modulation system in the mobile terminal.

In such a data communication system, data is communicated between the master station and mobile terminals by using two or more ASK modulated channels in the non-operating section with a certain frequency interval.

If a rectangular pulse as shown in FIG. 18A is used as a modulation pulse, in a general ASK modulator, the frequency spectrum of a transmission signal as shown in FIG. 18B is that a rectangular pulse (modulating wave) is developed as Fourier series.

But, this frequency spectrum includes an odd high level higher harmonic component in addition to a modulation component that is necessary for data transfer. This higher harmonic component raises a problem of adjacent-channel interference with other communication channels or failure to satisfy the occupied frequency bandwidth defined by the radio law.

On the other hand, the binary ASK modulated wave is obtained by turning on/off a carrier wave, but if a carrier leak is large while the carrier is turned off, the carrier detection circuit of the demodulator in the receiver side of the master station may malfunction, and the carrier leak must be sufficiently lowered.

A method has been proposed to reduce the unintended out-band radiation due to the higher harmonic component and carrier leak power.

For example, to reduce the higher harmonic component, the JP-A-No.167645/1992 discloses the method to apply a modulation pulse of rectangular wave to an ASK modulator through an integration circuit composed of a resistor and a capacitor.

FIG. 19 is a block diagram showing the ASK modulating circuit mentioned in the above reference.

A data signal is applied to the base of a transistor 403 through a base resistor 407 via an integration circuit 404 composed of a resistor 405 and a capacitor 406. The collector of the transistor 403 is connected to a transmission line 402 that input the output of a carrier signal generator 401.

When the data signal is applied through the integration circuit 404, a smooth modulated pulse is generated to reduce the unnecessary higher harmonic component level.

The method of the above reference decreases the higher harmonic component to a certain extent, but a desired characteristic can not be obtained in the data communication system that the present invention is applied. The reasons are described as below.

FIG. 20 shows the primary required characteristics of the ASK modulation apparatus adopted in the data communication system of the present invention. In FIG. 20, a carrier frequency is 6 GHz and a data modulation rate is 2 Mbps. The present modulation appratus performs binary ASK modulation under this condition. As the adjacent channel is allocated at 10 MHz away from the center frequency (6 GHz), the D/U ratio of the maximum power (non-modulated carrier power) to the adjacent channel leak power (hereinafter, referred to a D/U ratio) needs to be 40 dB or higher depending on the condition not to deteriorate the code error rate when transmitting data through the adjacent channel.

The on/off ratio of the maximum power when the carrier is off (non-modulated carrier power) to the carrier leak power (hereinafter, simply referred to an ON/OFF ratio) needs to be 20 dB or higher.

Further, a 99% occupied frequency bandwidth (hereinafter called an occupied bandwidth) must satisfy severe 8 MHzp-p or lower that is four times of 2 Mbps.

When using the ASK modulating circuit having the primary integration circuit described in the above patent, it is theoretically impossible to obtain the D/U ratio of 40 dB or higher while satisfying the occupied-bandwidth. Besides, it is also impossible to satisfy the required on/off ratio, because a high frequency component leaks to the output through the transmission line even while the carrier is off. This is the same even if the integration circuit is replaced by a secondary simple low-path filter.

With the primary or secondary simple integration circuit, for a step-like input signal such as a digital signal, the response waveform on the time axis for output signal rapidly changes, fails to smooth the signal completely, attenuates the high frequency component of a base band signal, and provides no effect to limit the frequency band. Further, as the input impedance of the band limit filter is not constant over a wide range of frequency, it is apt to cause ringing, overshoot and waveform disturbance against a base band signal like a digital signal including a high frequency component. This will unnecessarily expand the occupied frequency band. Thus, the desired characteristic can not be obtained.

As a method of decreasing the unnecessary out-band radiation due to the higher harmonic component, a digital filter is used because it is excellent in the band limit characteristic and is relatively easy to change data.

With the ASK modulation apparatus using a digital filter, the characteristic of the out-band higher harmonic component is satisfied, but a D/A converter and a memory to store data to meet the required spurious characteristic become necessary, the compactness as a mobile terminal will not be realized, and the battery driven low power consumption requirement will not be achieved.

SUMMARY OF THE INVENTION

An object of the present invention is to provide a microwave band ASK modulation apparatus and method which satisfies compactness, low power consumption and required modulation characteristics such as D/U ratio, occupied bandwidth and on/off ratio by using a passive element and not by using a large complex circuit such as a digital filter.

The objective of the present invention is achieved by an ASK modulation apparatus which modulates a rectangular high speed data signal within a microwave band comprising:

a band limiting means for waveform shaping to eliminate the inclination of an output waveform at rising of data signal by using a passive element, and an ASK modulating means for inputting carrier wave of a microwave band and ASK-modulating said carrier wave by turning off the drive voltage of a high frequency amplifier based on the output of said band limiting means.

The ASK modulation apparatus of the present invention uses a band limiting means to raise a rectangular data signal waveform with zero inclination. This decrease the higher harmonic component included in the rectangular pulse of the data signal. The high frequency amplifier of the ASK modulation means is operated on the band limited output from the band limiting means, and when the rectangular wave is at a logical level "1", it becomes in the operating region and amplifies the microwave band carrier. If the rectangular wave is at a logical level "0", it becomes in the cut-off state and cuts off the carrier output. As a result, it provides a preferable ASK modulated wave.

The ASK modulation apparatus further includes a drive means comprising a buffer amplifier for driving said high frequency amplifier in the output of said band limiting means.

With the drive means, the bank limiting circuit is stably operated.

The band limiting means comprises the N sets (N is an integer greater than 2) of basic circuit which are connected in cascade to data signal input and the grounded resistor R being connected to the output of the Nth stage of the said basic circuit. Each of the basic circuit comprises a coil L provided between input and output and a serial circuit being one end connected to the input of said coil L and other end connected to the ground, and the serial circuit having a resistor R and a capacitor C.

With two or more stages of the basic circuit, the output signal waveform can be smoothly raised with zero inclination though the input signal changes discontinuously (step-like).

The basic circuit is composed to satisfy $L=CR^2$.

The connection number N and the constant of said basic circuit depends on the time response of said data signal.

Further, the connection number N and the constant of the basic circuit depends on the rise time of the rectangular wave of said data signal, the suppression of the out-band unnecessary higher harmonic component and adjacent carrier component of said ASK modulation wave.

The buffer amplifier comprises is two transistors combined in the emitter-follower type.

The buffer amplifier comprises an operational amplifier.

The buffer amplifier comprises an operational amplifier and a current amplifier.

The high frequency amplifier comprises a field effect transistor or bipolar transistor amplifier connected to M stages (M is an integer greater than 1).

To achieve the above object, the present invention provides an ASK modulation apparatus which modulates a rectangular high speed data signal within a microwave band comprising:

a band limiting circuit having four basic circuits that are connected in cascade to said data signal input, each of said basic circuits having a coil L provided between input and output and a serial circuit being one end connected to the input of said coil L and other end connected to the ground, said serial circuit having a resistor R and a capacitor C; and the grounded resistor R is connected to the output of the 4th stage of the said basic circuit, and an ASK modulating means for inputting the carrier wave of a microwave band and ASK modulating said carrier wave by turning off the drive voltage of a high frequency amplifier based on the output of said band limiting means.

The ASK modulation apparatus further includes a drive means comprising a buffer amplifier for driving said high frequency amplifier in the output of said band limiting means.

To achieve the above object, the present invention provides an ASK modulation apparatus which modulates a rectangular high speed data signal within a microwave band comprising:

a band limiting circuit having four basic circuits that are connected in cascade to said data signal input, each of said basic circuits having a coil L provided between input and output and a serial circuit being one end connected to the input of said coil L and other end connected to the ground, said serial circuit having a resistor R and a capacitor C; and the grounded resistor R is connected to the output of the 4th stage of the said basic circuit, a buffer amplifier having the first and second transistors connected to said band limiting circuit and combined in the emitter-follower type and a high frequency amplifier circuit having a source grounded type field effect transistor (FET) which inputs the output of said buffer amplifier to the drain and the carrier of the microwave band to the gate.

To achieve the above object, the present invention provides an ASK modulation apparatus which modulates a rectangular high speed data signal within a microwave band comprising:

a band limiting circuit having four basic circuits that are connected in cascade to said data signal input, each of said basic circuits having a coil L provided between input and output and a serial circuit being one end connected to the input of said coil L and other end connected to the ground, said serial circuit having a resistor R and a capacitor C; and the grounded resistor R is connected to the output of the 4th stage of the said basic circuit, a buffer amplifier having an operational amplifier connected to said band limiting means and a current amplifier connected to the output of the operational amplifier, and a high frequency amplifier circuit having a source grounded type field effect transistor (FET) which inputs the output of said buffer amplifier to the drain and the carrier of the microwave band to the gate.

To achieve the above object, the present invention provides an ASK modulation method which modulates a rectangular high speed data signal within a microwave band comprising:

a step of band limiting for waveform shaping to eliminate the inclination of an output waveform at rising of said data signal by using a passive element, a step of inputting the carrier wave of a microwave band, and a step of ASK modulating said carrier wave by turning off the drive voltage of said high frequency amplifier based on said band limited signal.

The ASK modulation method of the present invention limits the band for waveform shaping with zero inclination of the output waveform in rising of data signal, thereby decreasing the higher harmonic component included in the rectangular pulse of the data signal. As a result, the occupied bandwidth of the output modulation wave and the adjacent channel leak power will be decreased.

The band limiting is characterized by; N sets (N is an integer greater than 2) of basic circuit which are connected to the said data signal input, each of said basic circuits having a coil L provided between input and output and a serial circuit being one end connected to the input of said coil L and other end connected to the ground, said serial circuit having a resistor R and a capacitor C, and the grounded resistor R is connected to the output of the Nth stage of said basic circuit.

The number of stages and the circuit constant of said basic circuit is decide by:

a step of calculating the output response assuming the time constant T as a parameter when N=2 and L/R=T, a step of first determining whether said output response satisfies the given D/U ratio and occupied bandwidth, a step of second determining whether said output response satisfies rises within the minimum pulse wide when the rectangular pulse is an input, a step of deciding the number N of stages and the circuit constant of that time when said first and second determining results are both satisfied, and a step of increasing N and repeating said first determining step and second determining step when one of said first and second determining results is not satisfied.

In said first determining, only one of the D/U ratio and occupied bandwidth can be judged on some conditions of the transmission system.

BRIEF DESCRIPTION OF THE INVENTION

This and other objects, features, and advantages of the present invention will become more apparent upon a reading of the following detailed description and drawings, in which.

Figure 3:
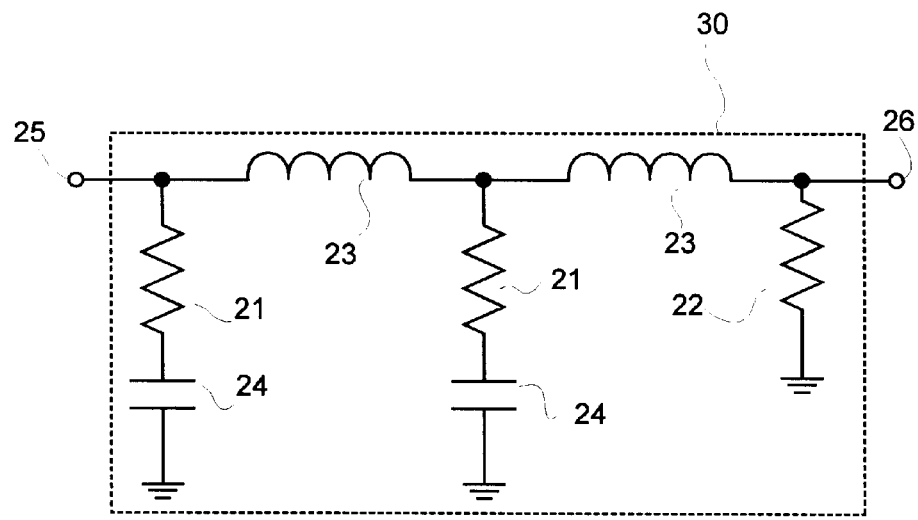
Figure 4:
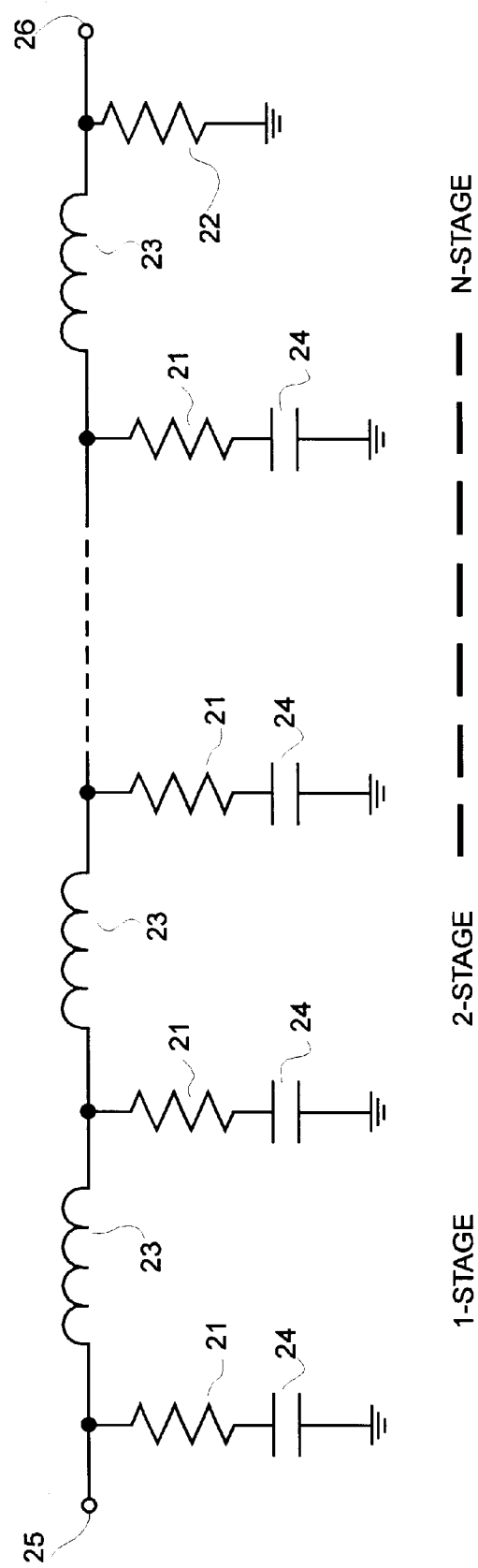
Figure 5:
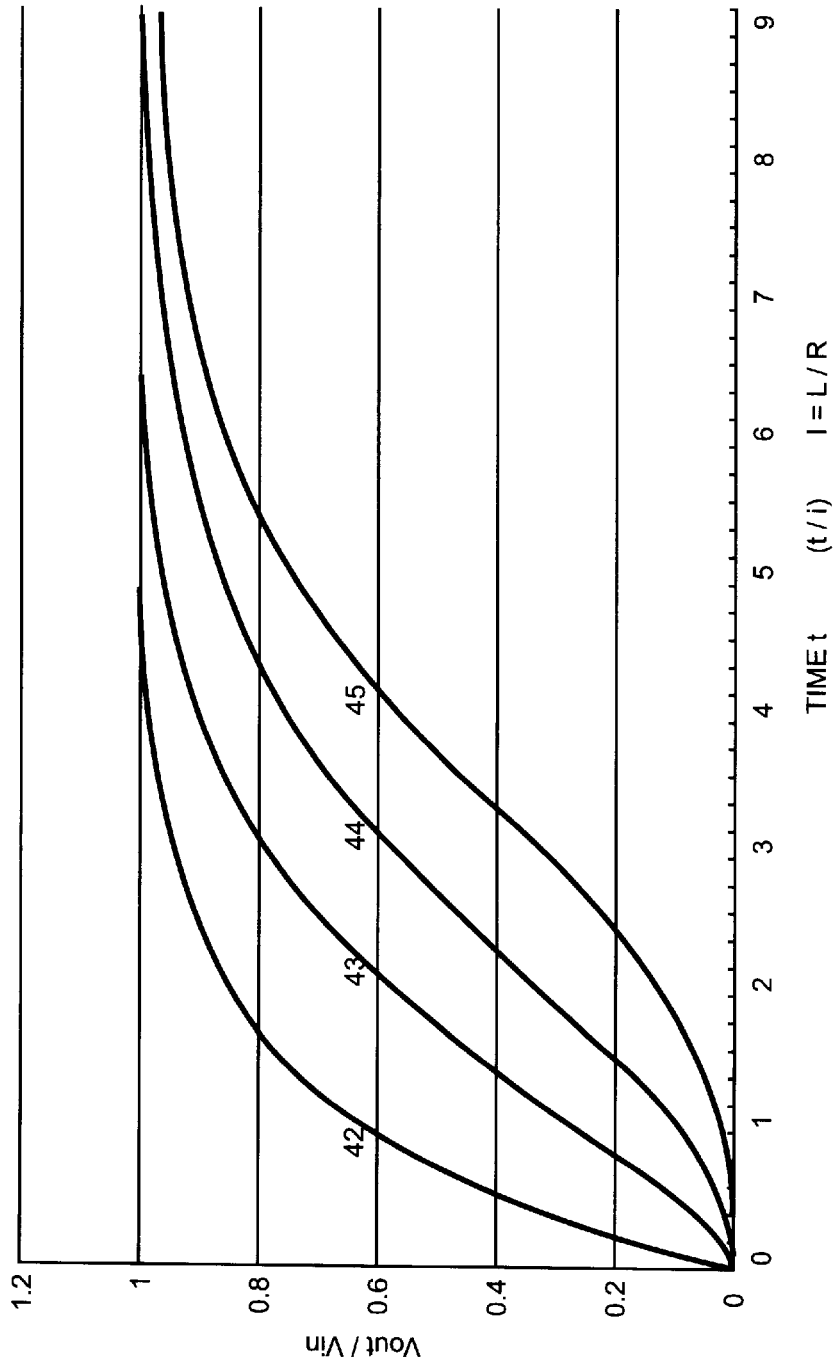
Figure 6:
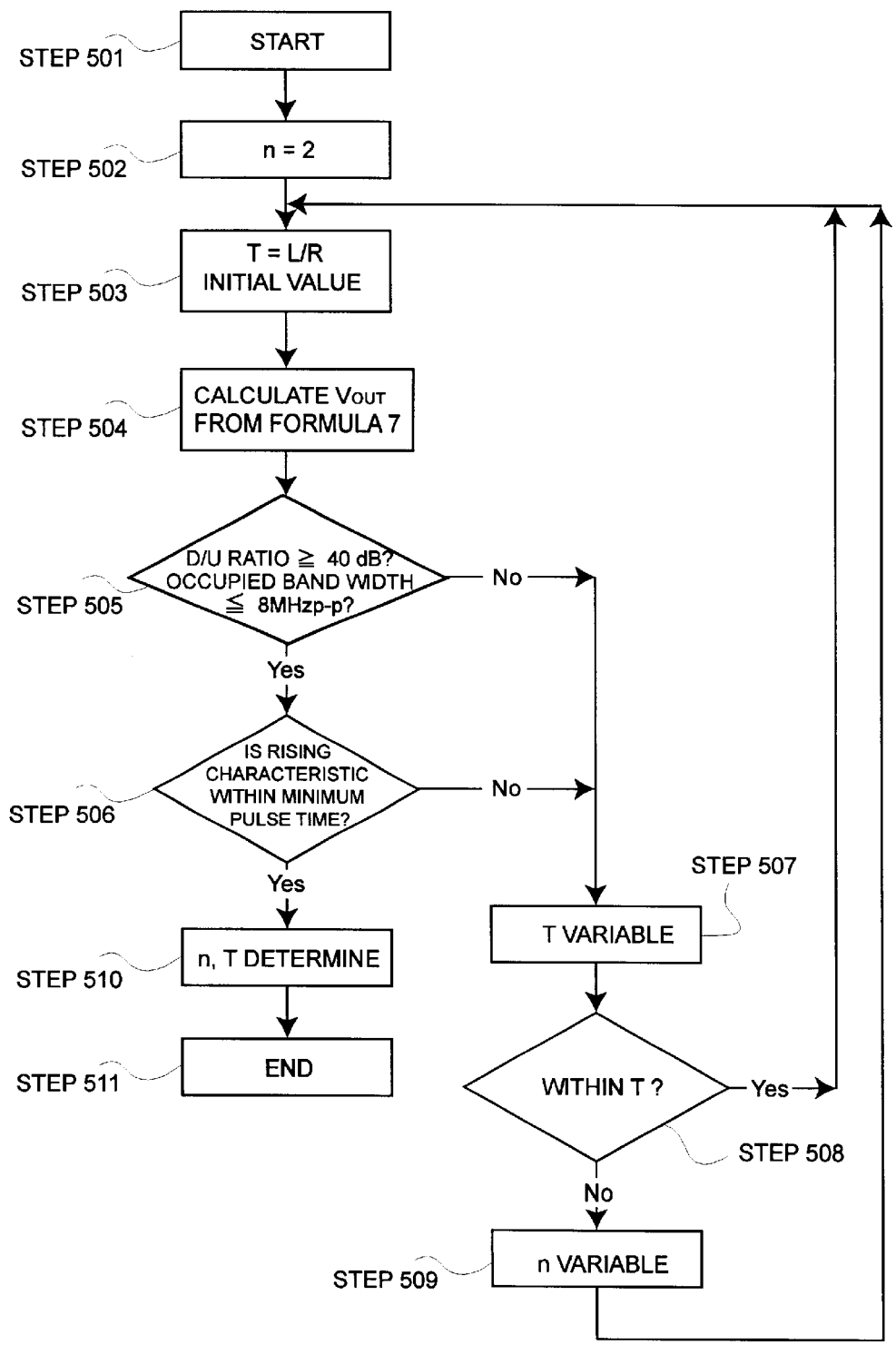
Figure 7:
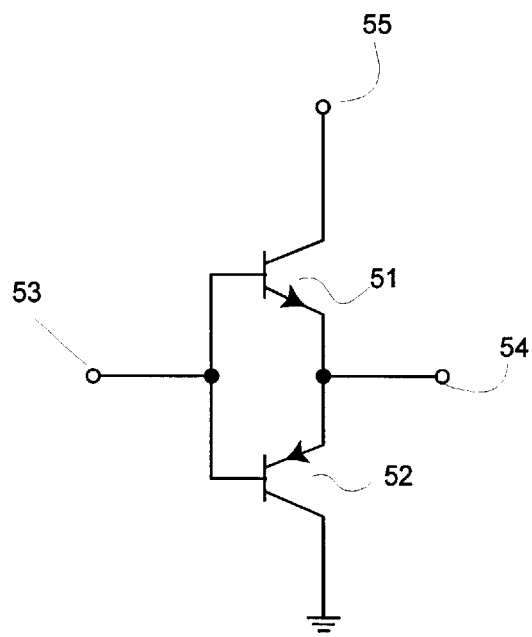
Figure 8:
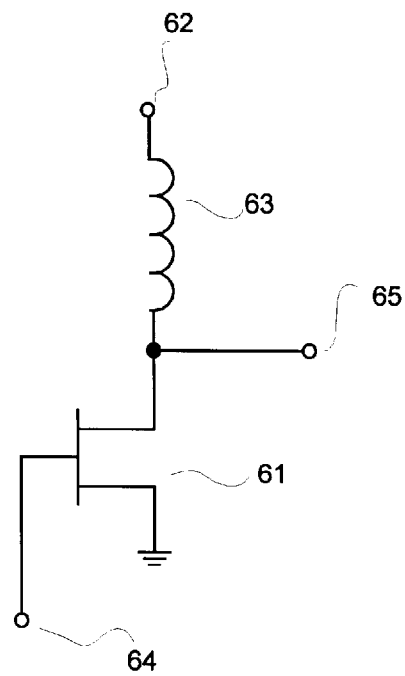
Figure 9:
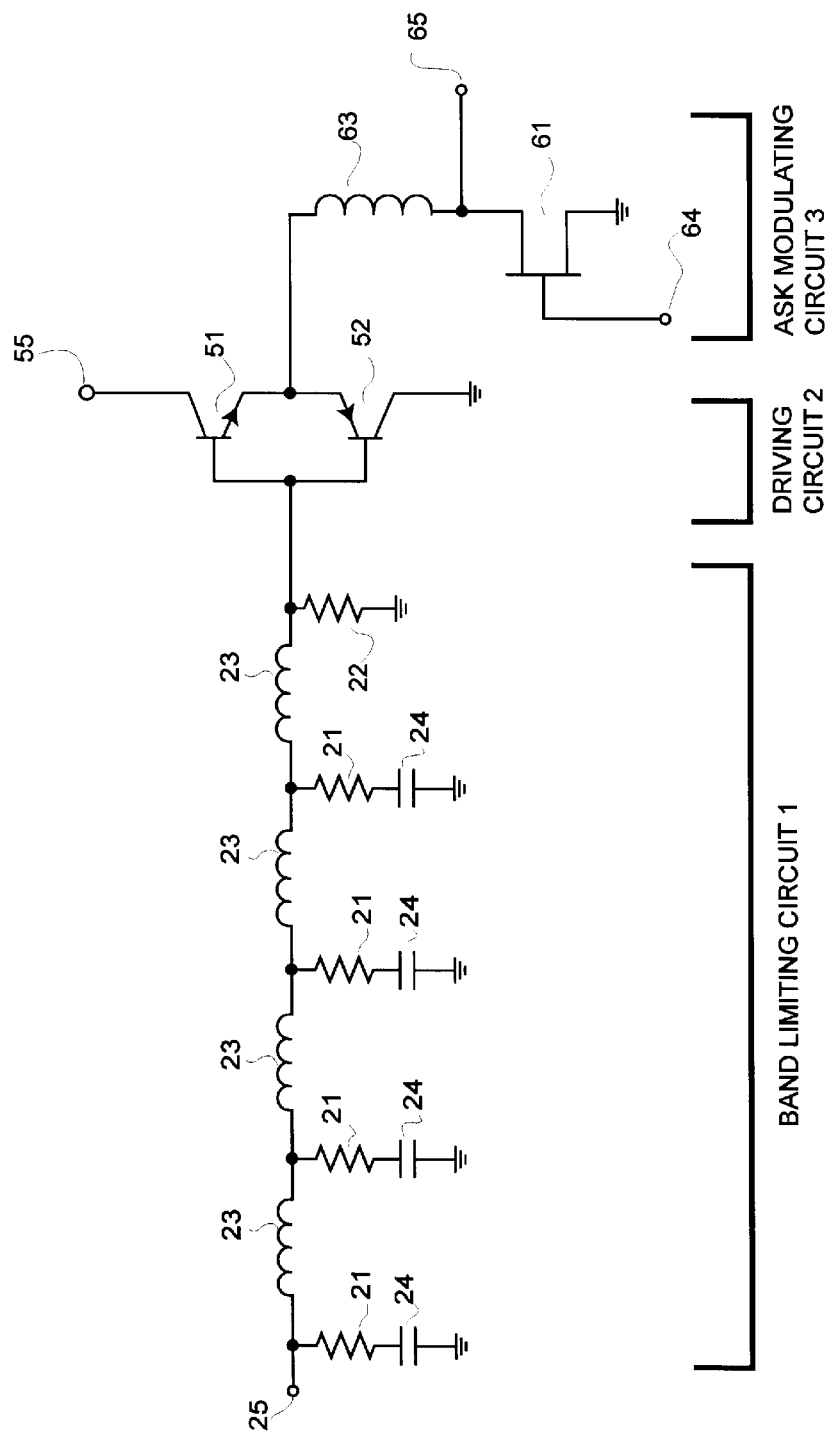
Figure 10:
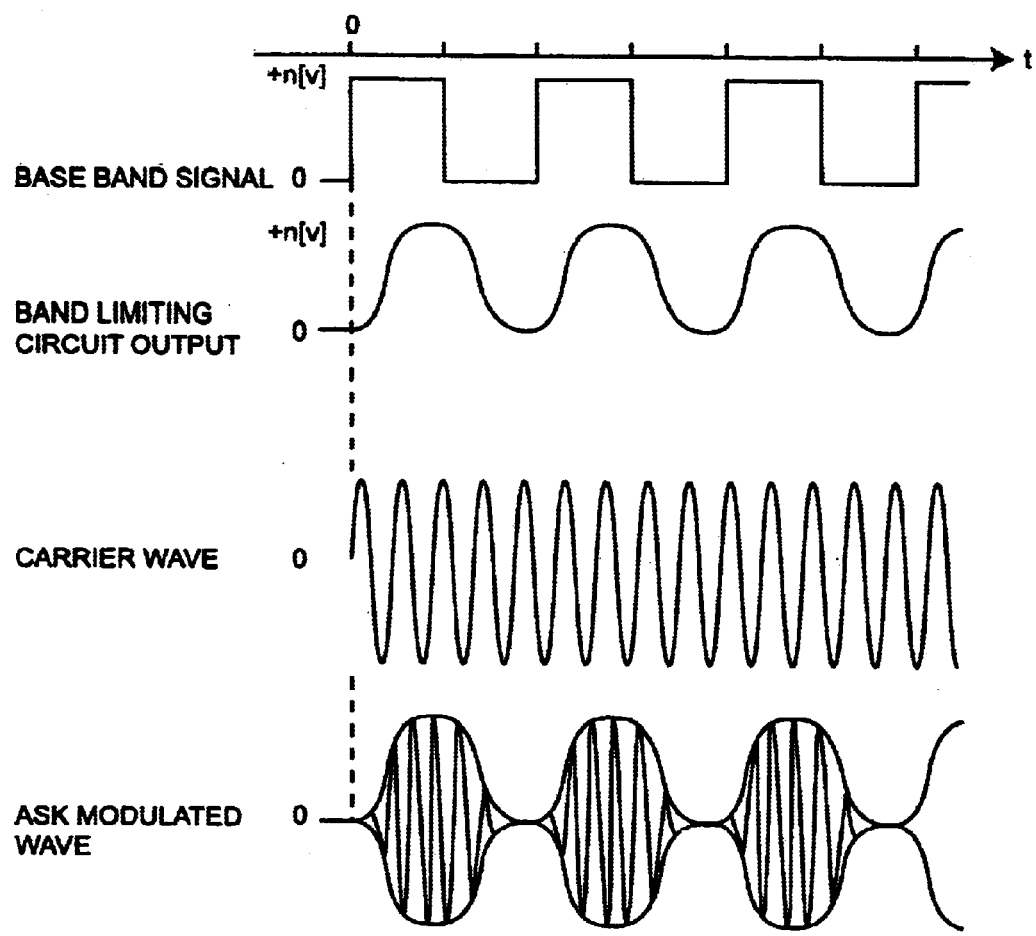
Figure 11:
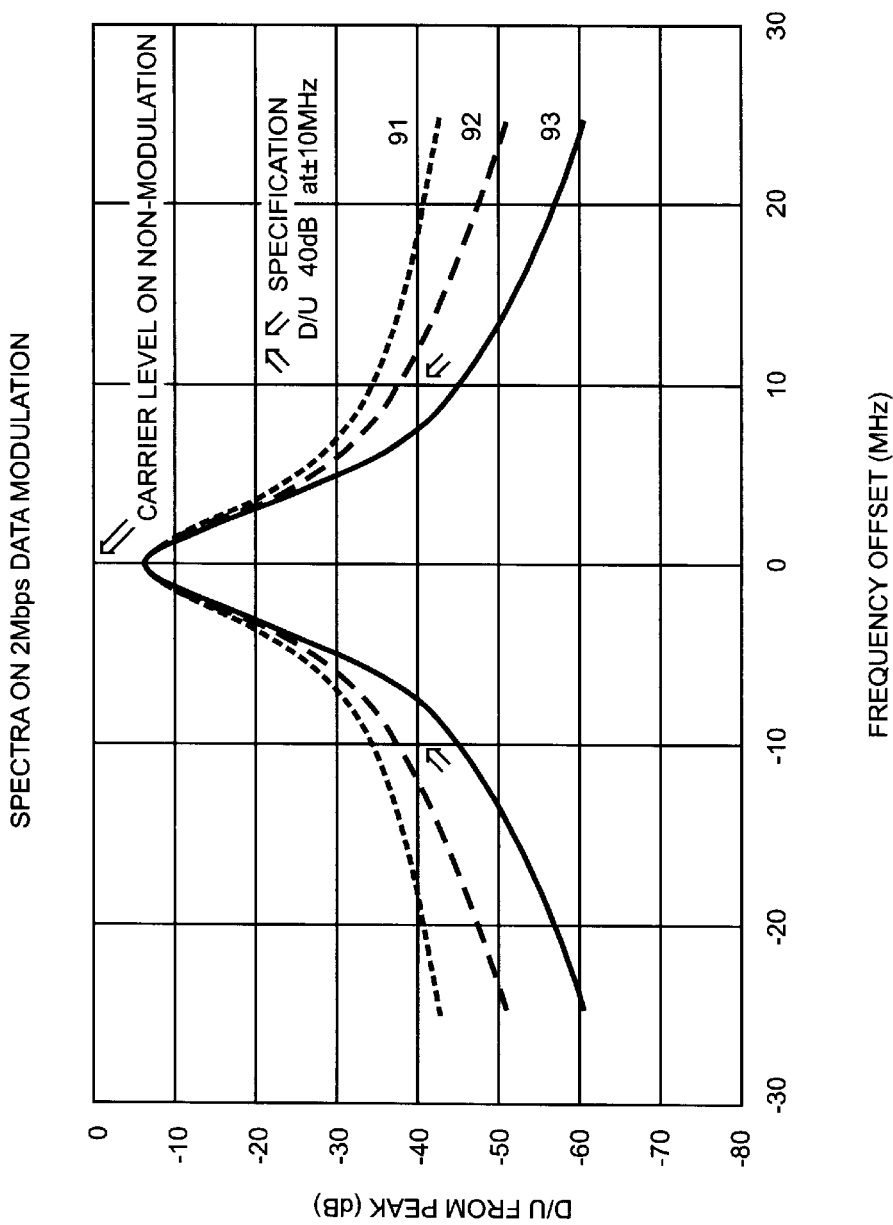
Figure 12:
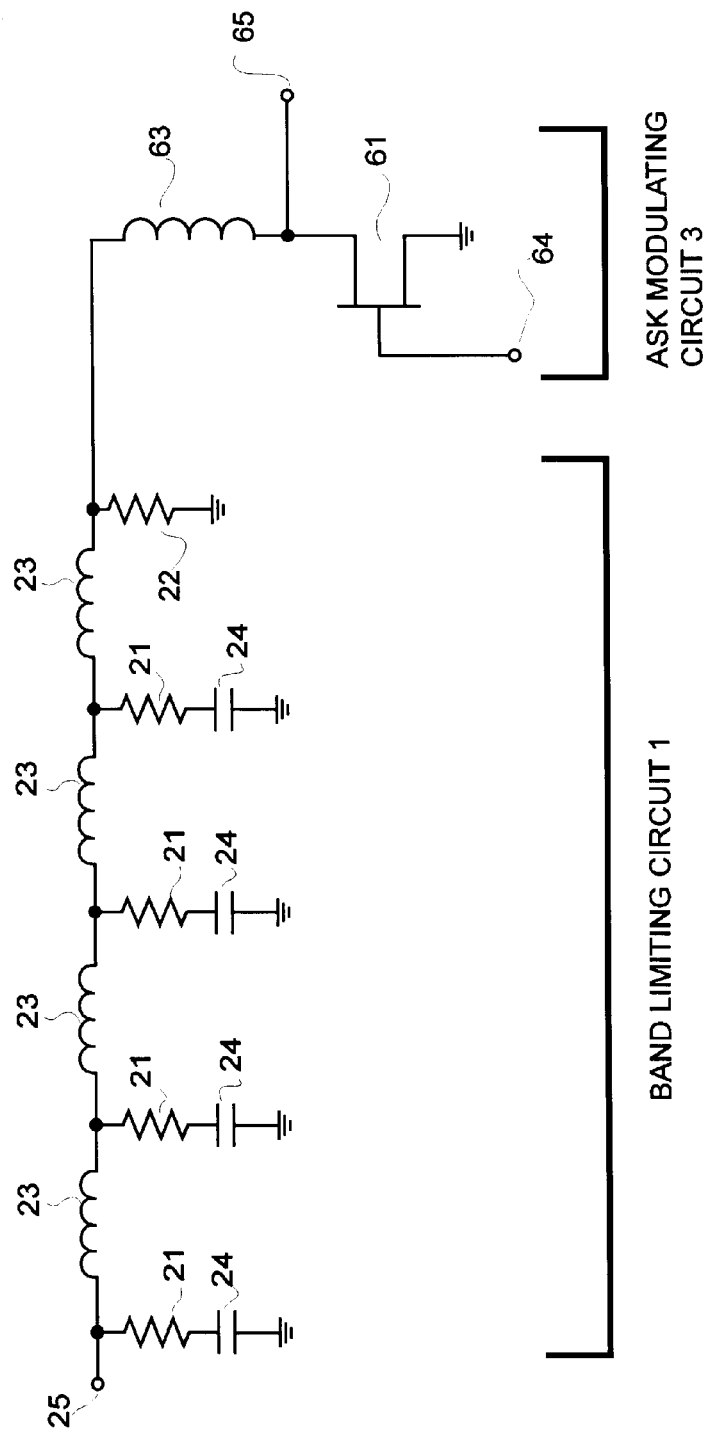
Figure 13:
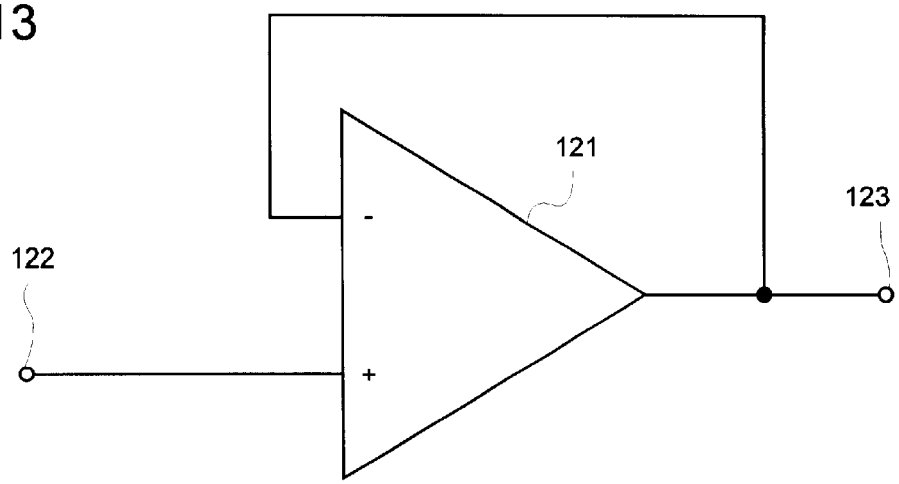
Figure 14:
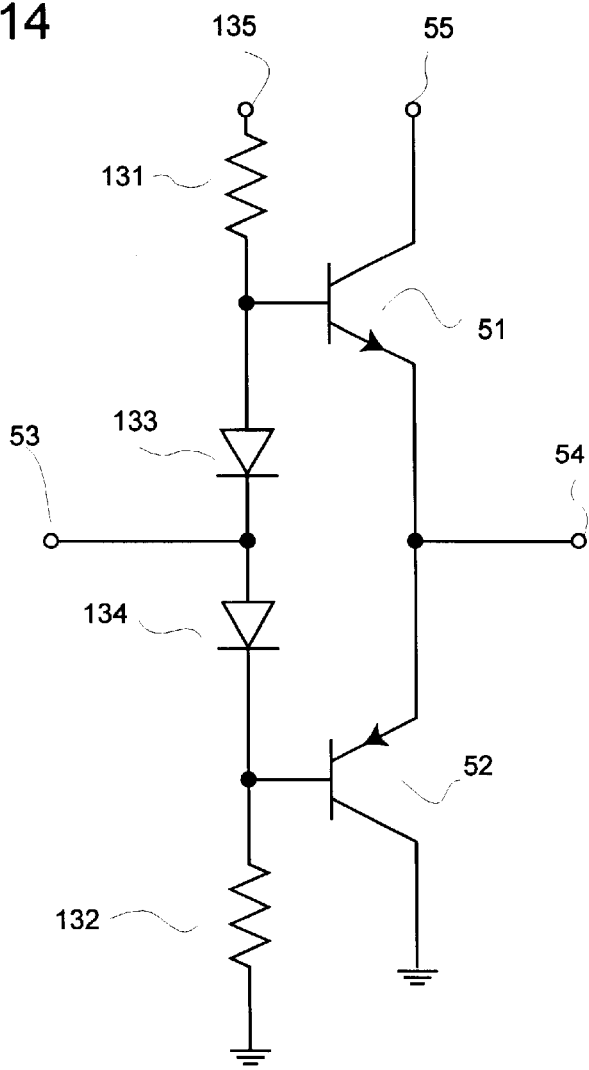
Figure 15:
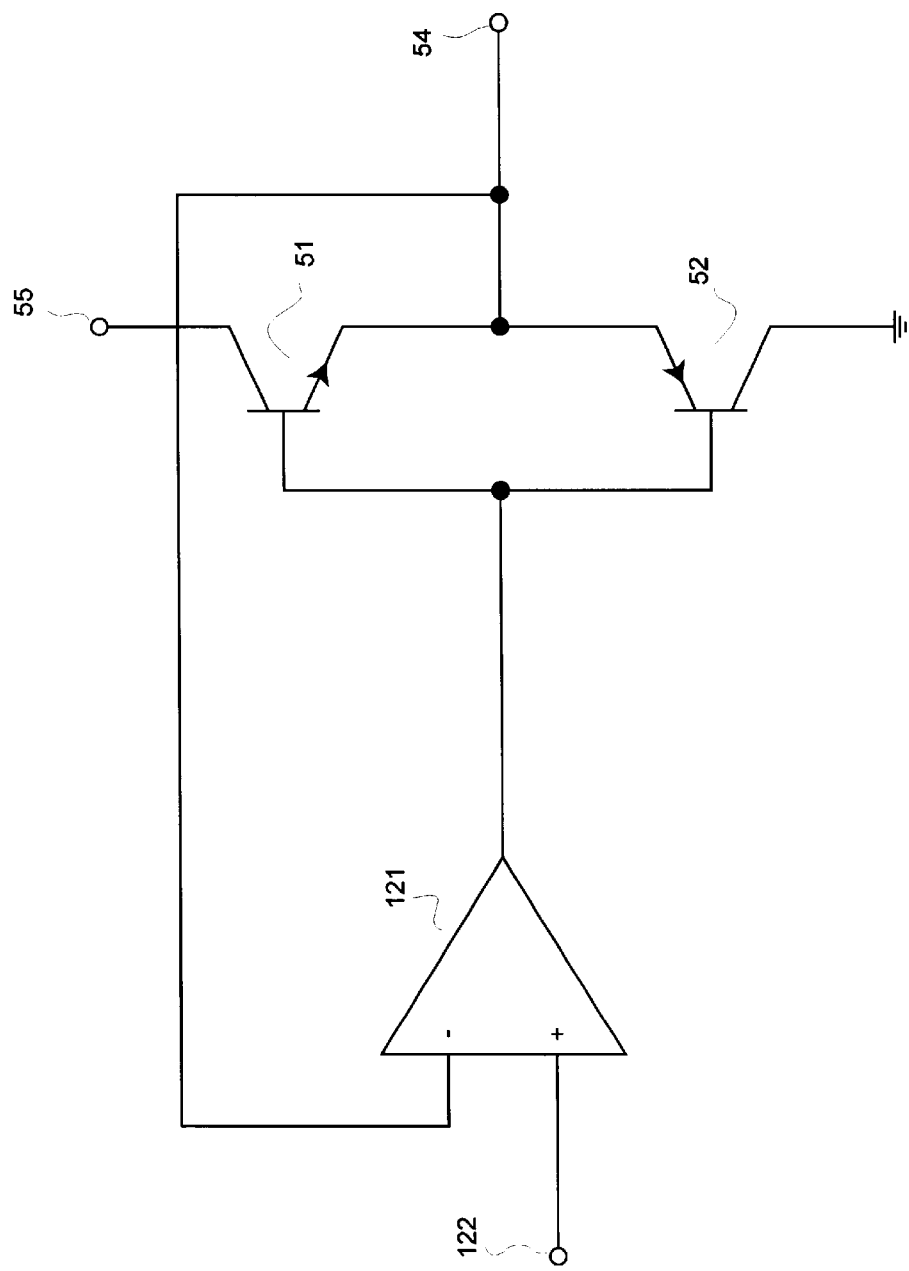
Figure 16:
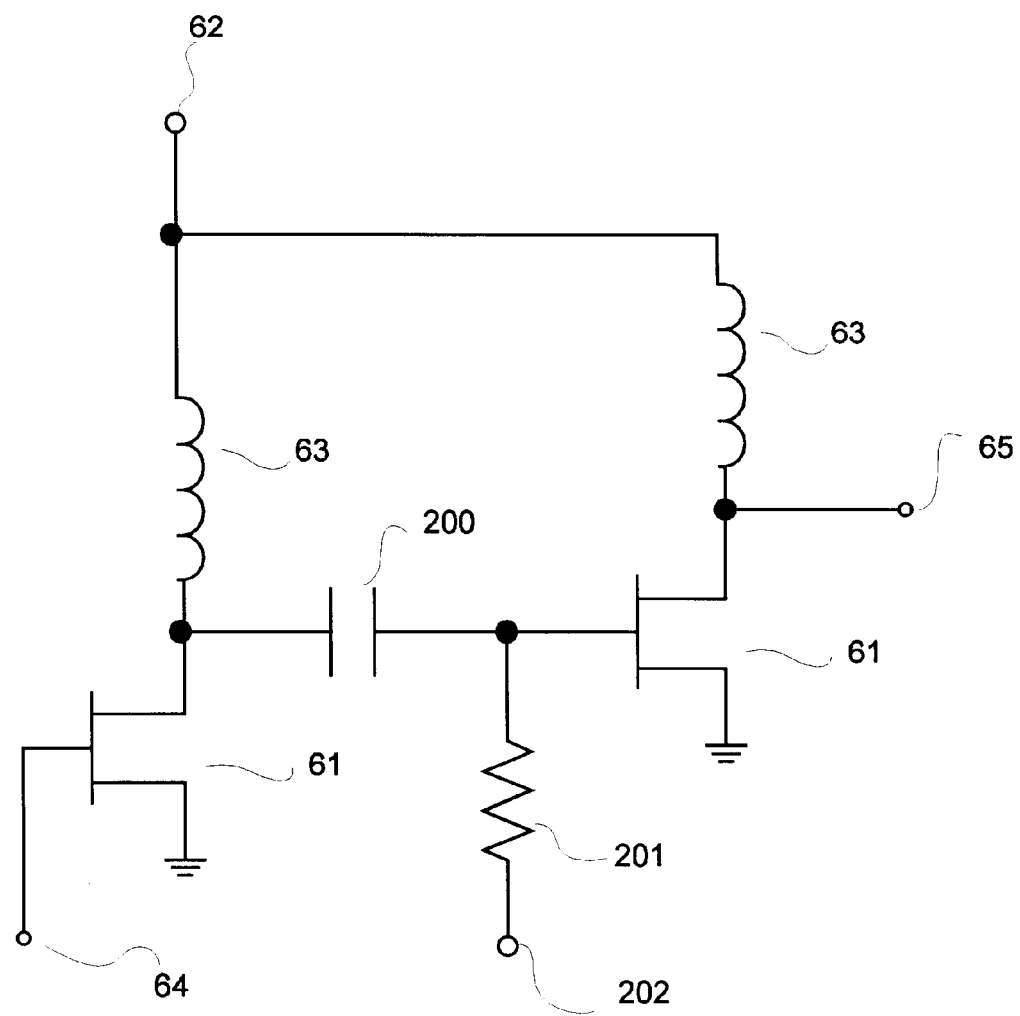
Figure 17:
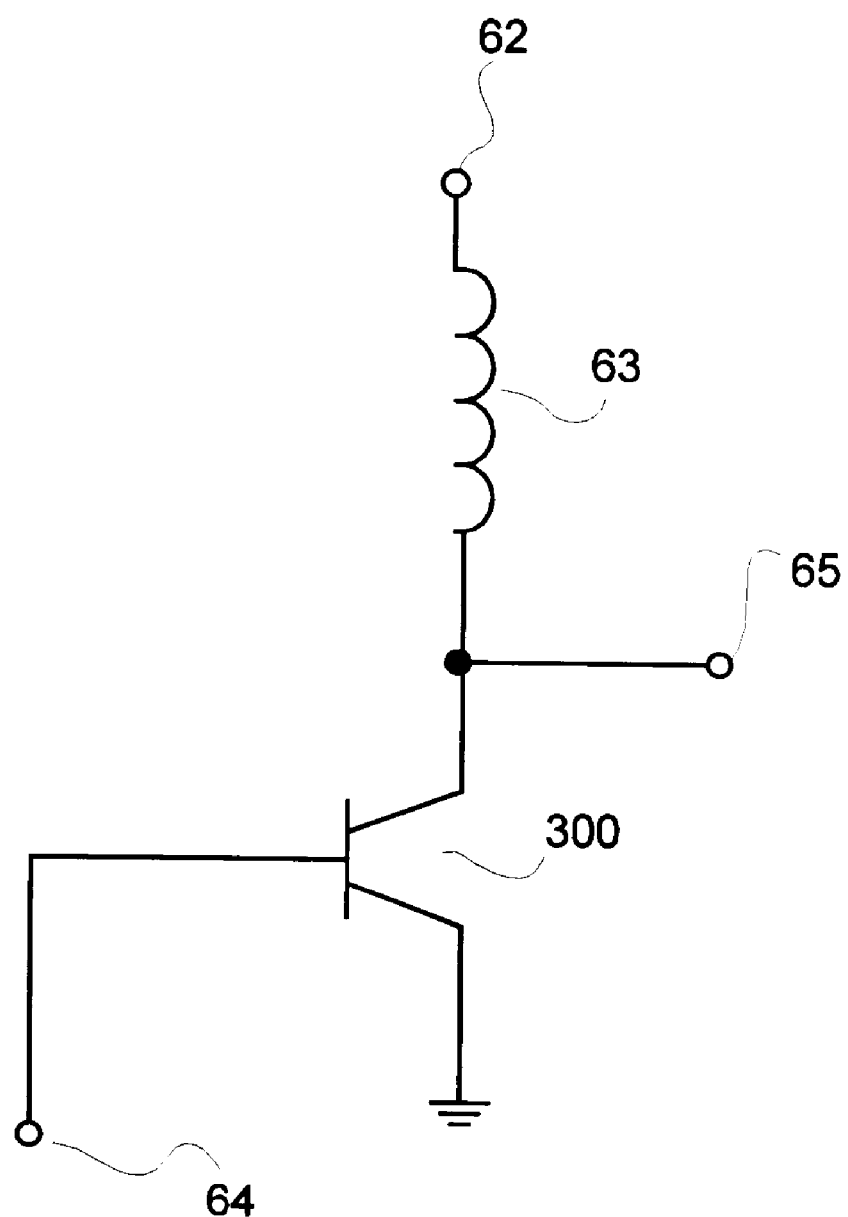
Figure 18A:
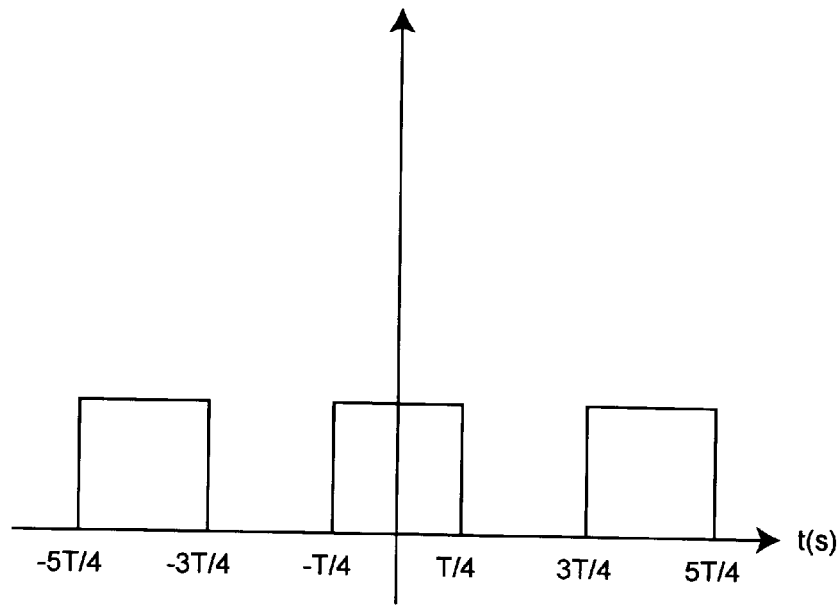
Figure 18B:
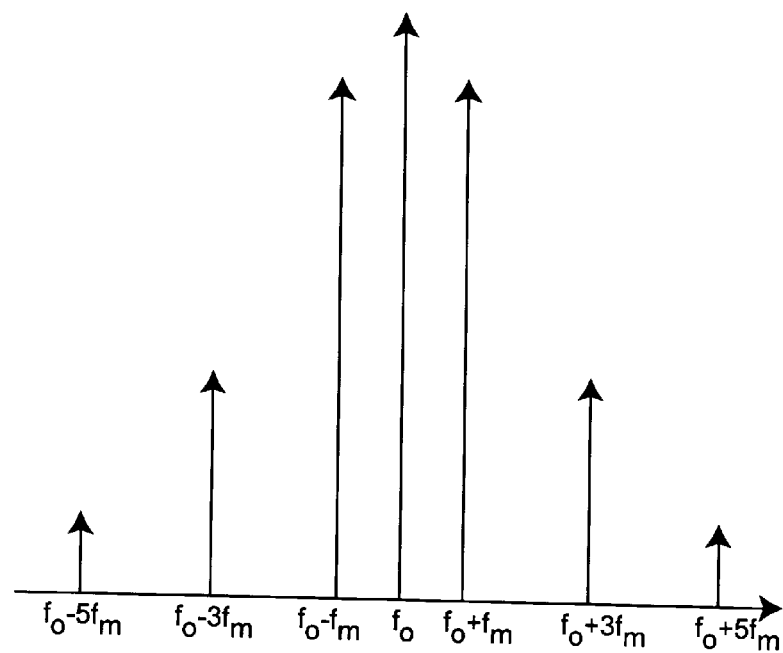
Figure 19:
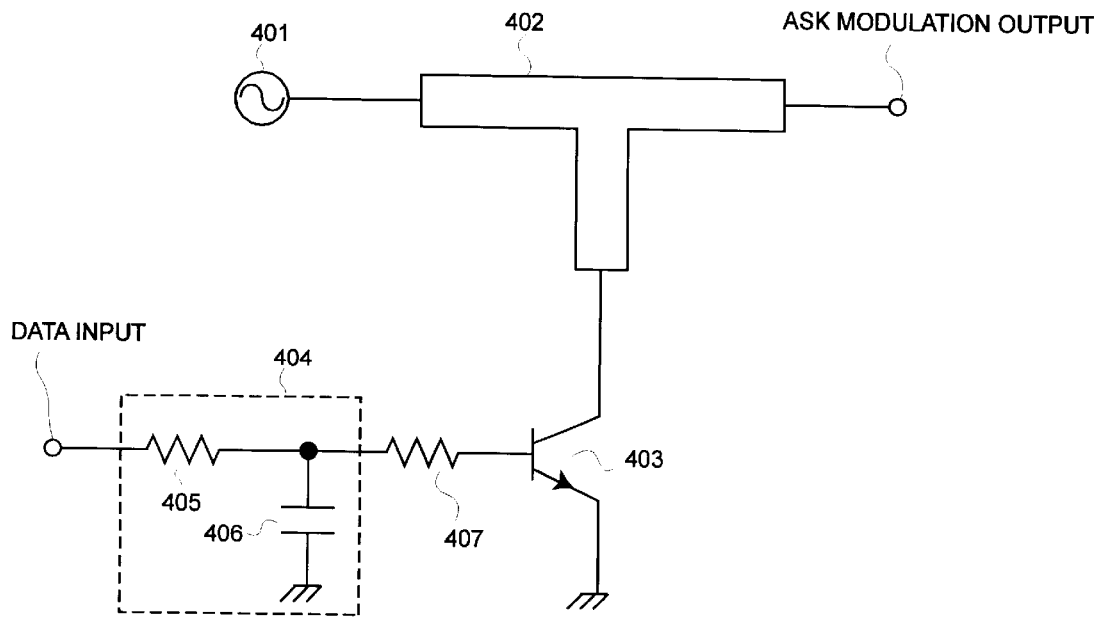

FIG. 3 shows a configuration of the 2-stage circuit 30 which constitutes the band limiting circuit 1;

FIG. 4 shows a configuration of the N-stage circuit which constitutes the band limiting circuit 1;

FIG. 5 shows a step response waveform for each case when the band limiting circuit 1 is a 1-stage circuit, a 2-stage circuit, a 3-stage circuit and a 4-stage circuit;

FIG. 6 is a flowchart showing the method of determining the number of stages and constant of the band limiting circuit 1;

FIG. 7 shows an example of the circuit configuration of a driving circuit 2;

FIG. 8 shows an example of the circuit configuration of an ASK modulating circuit 3;

FIG. 9 shows an example of the circuit configuration of the ASK modulation apparatus of the present invention;

FIG. 10 shows the signal waveforms of each part of the ASK modulation apparatus shown in FIG. 9;

FIG. 11 compares the modulation characteristics of the ASK modulation apparatus shown in FIG. 9, the ASK modulation apparatus having no band limiting circuit and the ASK modulation apparatus having an integration circuit;

FIG. 12 shows a circuit configuration of the second embodiment of the ASK modulation apparatus;

FIG. 13 shows a circuit configuration of another embodiment of the driving circuit 2;

FIG. 14 shows a circuit configuration of another embodiment of the driving circuit 2;

FIG. 15 shows a circuit configuration of another embodiment of the driving circuit 2;

FIG. 16 shows a circuit configuration of another embodiment of the ASK modulation circuit 3;

FIG. 17 shows a circuit configuration of another embodiment of the ASK modulation circuit 3;

FIG. 18A and FIG. 18B show the frequency spectra of the ASK modulation pulse and ASK modulation wave;

FIG. 19 shows a circuit configuration of the prior art; and

Figure 20:
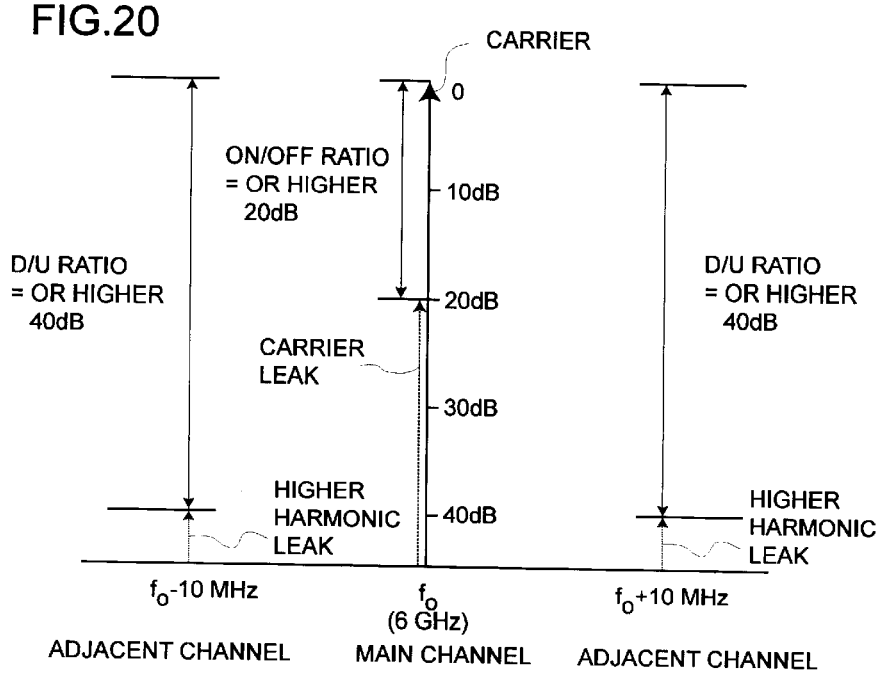

FIG. 20 shows the ASK modulation characteristics demanded for the present invention.

DESCRIPTION OF THE EMBODIMENTS

An embodiment of the present invention is described.

Figure 1:
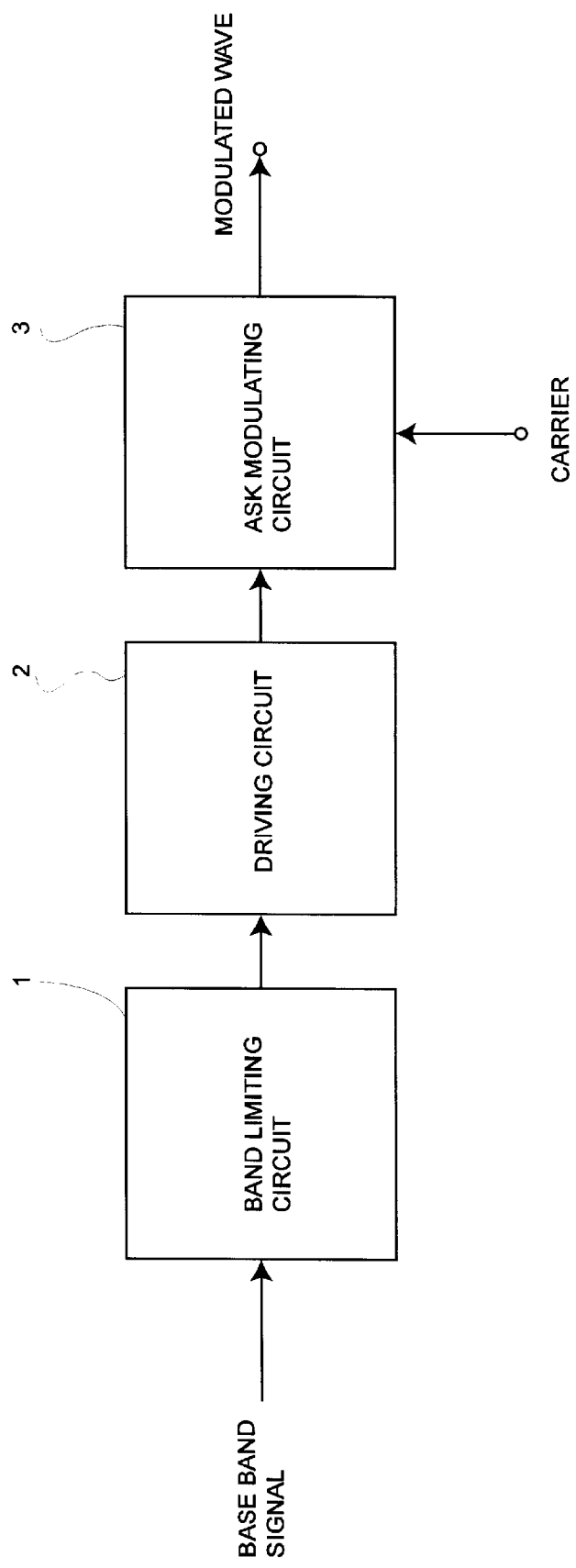
FIG. 1 shows a block diagram of the first embodiment of the ASK modulation apparatus of the present invention.

FIG. 1 is a block diagram of the ASK modulation apparatus embodying the present invention.

A reference numeral 1 designates a band limiting circuit. The band limiting circuit 1 is a constant impedance circuit comprising a passive element, and having a constant input impedance independently of frequency of the input signal. The band limiting circuit 1 inputs a high speed data signal with a rectangular pulse wave, and smoothes the rectangular pulse (data) against the response on the time axis thereby limiting the frequency band.

A reference numeral 2 designates a driving circuit. The driving circuit 2 functions as a buffer amplifier with a voltage gain of 1 between the band limiting circuit and an ASK modulating circuit 3 described later. Therefore, the voltage waveform output from the driving circuit 2 is the same as the output voltage waveform of the band limiting circuit 1.

A reference numeral 3 designates an ASK modulating circuit. The ASK modulating circuit 3 comprises a high frequency amplifier which is operated on the output (modulating signal) from the driving circuit 2. The high frequency amplifier goes into the operating region when the rectangular pulse of an input signal is at the logic level "1", and amplifies the microwave band carrier. On the other hand, if the rectangular pulse is at the logical level "0", it goes into the cut-off state, and cuts off the carrier output. As a result, the ASK modulating circuit 3 binary ASK-modulates based on the output (modulating signal) from the driving circuit 2, and a desired ASK modulated wave can be generated.

As seen from the above configuration, the present invention is characterized by providing the band limiting circuit 1 for controlling tine axis response for the baseband signal of rectangular waveform between a rectangular pulse baseband signal input and the ASK modulating circuit 3 comprising a high frequency amplifier, and the high frequency amplifier is turned on/off based on the output signal from the band limiting circuit 1 thereby performing binary ASK modulation.

The circuits of the above embodiment are described in detail below.

First, operation of the basic circuit 20 which constitutes the band limiting circuit 1 is explained. The basic circuit 20 is called a 1-stage circuit for description convenience.

Figure 2:
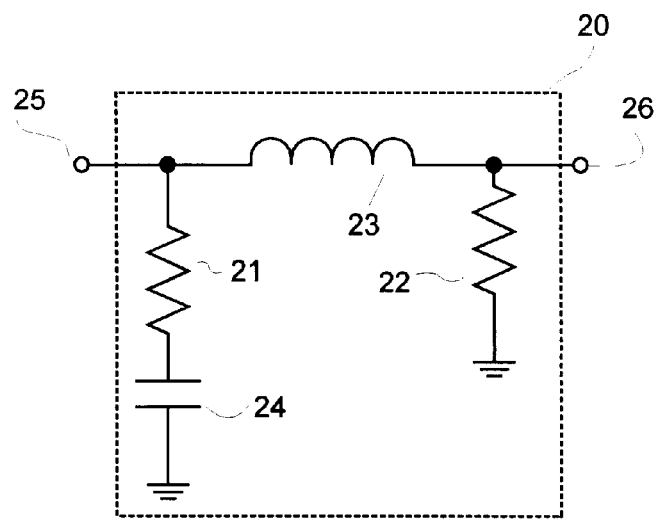
FIG. 2 shows a configuration of the basic circuit 20 which constitutes the band limiting circuit 1.

As shown in FIG. 2, the basic circuit 20 comprises a resistor 21, a resistor 22, a coil 23 and a capacitor 24.

The coil 23 is connected between the input terminal 25 and the output terminal 26. The serial circuit comprising the resistor 21 and capacitor 24 and the resistor 22 are connected to both ends of the coil 23, respectively. The other ends of the serial circuit and resistor 22 are grounded, respectively.

In the basic circuit 20 configured as above, assuming the circuit constant for the resistors 21 and 22 as R, the circuit constant for coil 23 as L and the circuit constant for the capacitor 24 as C, the input impedance $Z_{in}(S)$ of the basic circuit 20 is calculated by the following formula 1.

$$Z_{in}(s) = \frac{s^2 LCR + s(CR^2 + L) + R}{s^2 LC + 2sCR + 1} \quad \text{formula 1}$$

Wherein, S=jω. The impedance connected to the output terminal 26 is assumed much larger than the value of R.

By setting each circuit constant to meet the formula 2;

$$L = CR^2 \quad \text{formula 2}$$

The following formula 3 can be obtained.

$$z_{in}(s) = R \quad \text{formula 3}$$

The input impedance $Z_{in}(S)$ becomes constant independently of the frequency, and only the resistance component R remains.

The resistor 22 connected to the output terminal 26 can be substituted by a load connected to the output side, but the value of this load must be the same as the value of the resistor 21.

The other circuits than the band limiting circuit 1 are described below.

FIG. 3 shows the configuration of the other circuits than the band limiting circuit 1.

The circuit 30 in FIG. 3 comprises another basic circuit 20 connected to the output terminal 26 of the basic circuit 20 instead of the resistor 22. The basic circuits are connected in series as shown in FIG. 3. This circuit 30 is called a 2-stage circuit for description convenience.

The impedance $Z_{in}(S)$ seen from the input terminal of the 2-stage circuit 30 is expressed by the following formula 4.

$$Z_{in}(s) = \left[ \frac{1}{R + \frac{1}{sC}} + \frac{1}{sL + \left( \frac{1}{R + \frac{1}{sC}} + \frac{1}{R + sL} \right)} \right] \quad \text{formula 4}$$

By setting the circuit constants to meet the following formula 2, as in case of the basic circuit 20;

$$L = CR^2 \quad \text{formula 2}$$

The following formula 3 can be obtained.

$$z_{in}(s) = R \quad \text{formula 3}$$

The input impedance $Z_{in}(S)$ becomes constant independently of the frequency, and only the resistance component R remains.

The 1-stage and 2-stage circuits of the embodiment have been described above. The circuit can be expanded further up to the n-stage circuit of the band limiting circuit 1 as shown in FIG. 4. Also, in this case, by setting the circuit constants to meet the following formula 2, as in case of the 1-stage and 2-stage circuits;

$$L = CR^2 \quad \text{formula 2}$$

The following formula 3 can be obtained.

$$z_{in}(s) = R \quad \text{formula 3}$$

Hereinafter, the time axis response upon input of digital signal to the 1-stage circuit 20 and the 2-stage circuit 30 of the band limiting circuit 1 of the present embodiment will be explained.

For simplicity of description, as a typical digital signal, a signal with time t=0 and $V_{in}$ volt amplitude is assumed as an input signal. The result for a general digital signal can also be easily extended from the following example, detailed description will be omitted.

Assuming the output voltage of the 1-stage circuit 20 as $V_{out}(t)$, it is calculated by the following formula 5.

$$V_{out}(t) = \begin{cases} V_{in} \cdot \left( 1 - e^{-\frac{R}{L}t} \right) & t \geq 0 \\ 0 & t < 0 \end{cases} \quad \text{formula 5}$$

Assuming the output voltage of the 2-stage circuit 30 as $V_{out}(t)$, it is calculated by the following formula 6.

$$V_{out}(t) = \begin{cases} V_{in} \cdot \left( 1 - e^{-\frac{R}{L}t} - \frac{R}{L} t \cdot e^{-\frac{R}{L}t} \right) & t \geq 0 \\ 0 & t < 0 \end{cases} \quad \text{formula 6}$$

When the circuit is further expanded, the output voltage $V_{out}(t)$ of the n-stage (n is a natural number) band limiting circuit is expressed by the following formula 7.

$$V_{out}(t) = \begin{cases} V_{in} \cdot \left\{ 1 - \left( \sum_{k=0}^{n-1} \frac{1}{k!} \cdot \left( \frac{R}{L} \right)^k \cdot t^k \cdot e^{-\frac{R}{L}t} \right) \right\} & t \geq 0 \\ 0 & t < 0 \end{cases} \quad \text{formula 7}$$

When the formulas 5, 6 and 7 are differentiated and the inclination of the tangent $V_{out}(t)$ to the step input signal $V_{in}$ at time t=0 is calculated, the following formula 8 is set up for the 1-stage basic circuit 20.

$$\left. \frac{\Delta V_{out}(t)}{\Delta t} \right|_{t \to 0} = V_{in} \cdot \frac{R}{L} \quad \text{formula 8}$$

For the 2-stage or more-stage circuit, the following formula 9 will become as follows.

$$\left. \frac{\Delta V_{out}(t)}{\Delta t} \right|_{t \to 0} = 0 \quad \text{formula 9}$$

Thus, when the number of circuit stage is increased to 2 or more, though the input signal changes discontinuously (step-like), the signal can be raised with zero inclination of the output signal waveform.

As a result, when the band limiting circuit 1 is connected in cascade to a 2 or more stages of circuit, the inclination of output response waveform can be eliminated when the rectangular pulse rises.

After a large time t, regardless of the number of stages, the result will smoothly approach to $V_{out}(t) = V_{in}$.

Therefore, finally, the same voltage as the input will be obtained at the output 26.

FIG. 5 shows the output waveforms 42, 43, 44 and 45 respectively for the 1-stage circuit, 2-stage circuit, 3-stage circuit and 4-stage circuit.

As seen from FIG. 5, as the number of stages increases, the output waveform rises more slowly. Contrarily, as the time to converge to the final value is extended, it is necessary to consider the number of stages and the circuit constant so as to converge within the minimum pulse duration of the input digital signal.

Actually, the number of stages and the circuit constant must be determined by considering the general characteristic when combining the later-stage input/output characteristic and modulation and making computer simulations or experiments.

As above described, the band limiting circuit 1 of the present embodiment, if it has two or more stages, will eliminate the rapidly changing discontinuous portion of the input digital signal waveform and shapes the signal to change smoothly.

As the transfer function H(s) of the band limiting circuit with n stages (n is a natural number) is expressed by the following formula 10;

$$H(s) = \frac{1}{\left(1 + s \cdot \frac{L}{R}\right)^n} \quad \text{formula 10}$$

The frequency characteristic of this time shows low-pass characteristic. Thus, it becomes obvious that the higher harmonic component of the signal can be attenuated even in stationary state and this effect is larger as the value of n is greater.

The concrete method of determining the number of stages and the circuit constant will be explained.

FIG. 6 is a flowchart showing the method of determining the number of stages and the circuit constant of the band limiting circuit 1.

As described above, by setting the number n of circuit stage to 2 or more, the signal can be raised with zero inclination of the output signal waveform though the input signal changes discontinuously (step-like).

Thus, first set n=2 and substitute 2 for n in the formula 7 to obtain the output response (step 502). Calculate by taking the time constant T when L/R=T as a parameter (step 504).

For a certain time constant T, determine whether the out band unnecessary higher harmonic component and adjacent channel interference requirement (D/U ratio=40 dB or higher, and occupied bandwidth=8 MHzp-p or less) are satisfied depending on the output response condition. (Step 505).

Further, as a second condition, determine whether the minimum pulse width rising characteristic is satisfied. (Step 506). For example, as Manchester code is used in the data transmission system to which the present invention is applied, a data signal of duty 50% requires 500 ns to become the logic level "1". Therefore, the output waveform of the band limiting circuit 1 needs to be 90% or more of the maximum amplitude within 500 ns.

Obtain the time constant T that satisfies the above conditions by varying the time constant in this way (Step 503–508). If such a time constant exists, decide the circuit constant from this time constant. (Step 510)

If an appropriate time constant is not obtained, repeat the same process for n=3. (Step 509)

Determine the number n of circuit stage and the time constant T that satisfy the first and second conditions by gradually increasing the value of n.

After the time constant T is decide, the circuit constant L, C, R will be determined from $L=CR^2$.

For example, when the above mentioned system is calculated based on the flowchart of FIG. 6, the number N of stages=4, R=1 kΩ, C=50 pF and L=50 μH.

In the above description, the circuit constants of each stage of the circuit are identical. However, if the formula 2 is satisfied and the input impedance is unified in each stage, it is possible to select different capacitor capacity and coil inductance in each stage. But, if the circuit constants are different in each stage, the circuit design becomes difficult and analysis is complicated. So, as in the embodiment of the present invention, it is desirable to connect several basic circuits and unify the circuit constants as a whole band limiting circuit.

In the above description, the first and second conditions are determined for the data communication system to which the present invention is applied. It is obvious that the actual conditions differ depending on the data communication system to be used. For a certain data communication system, it may be sufficient to consider only the D/U ratio or the occupied bandwidth. In this case, it is sufficient to consider only the D/U ratio or the occupied bandwidth in the step (505) of the first condition.

The driving circuit 2 will be explained below.

As shown in FIG. 7, the driving circuit 2 comprises two transistors 51 and 52 combined as an emitter-follower. The reference numeral 53 is the input terminal to input the signal from the band limiting circuit 1. The reference numeral 54 is the output terminal to supply power from the terminal 55.

The driving circuit 2 is provided between the band limiting circuit 1 and ASK modulating circuit 3 and functions as a buffer amplifier with voltage gain of 1. Therefore, it is a current booster circuit to receive the output voltage from the band limiting circuit 1 and outputs the same voltage. The voltage waveform output from the driving circuit 2 becomes almost the same as the output voltage waveform of the band limiting circuit 1.

The circuit shown in FIG. 7 is of the emitter-follower type with high input impedance and low output impedance, and the band limiting circuit 1 operates ideally. It allows to take in and discharge large current for the ASK modulating circuit 3 of the output side. Accordingly, even if the current to be supplied to the ASK modulating circuit 3 or the load increases, the driving circuit 2 can drive it directly.

The ASK modulating circuit 3 will be explained below.

FIG. 8 shows the configuration of the high frequency amplifier circuit that is used as an example of the ASK modulating circuit 3 in the embodiment of the present invention.

The high frequency amplifier circuit is the source grounded type high frequency amplifier using a field effect transistor (FET) 61. As shown in FIG. 8, the drain terminal of the field effect transistor 61 is connected with a high frequency choke coil 63 that is connected to the terminal 62 to which the signal is applied from the driving circuit 2.

When the power (the high level output from the driving circuit 2) is supplied to the drain terminal of the field effect transistor 61, an appropriate gate bias is given so that the high frequency carrier supplied from the carrier input terminal 64 to the gate terminal is amplified and transmitted (not illustrated).

On the other hand, when the power supply for the field effect transistor 61 is interrupted (the low level output from the driving circuit 2), a carrier is not outputted at the modulated wave output terminal 65.

Therefore, by turning on/off the rectangular pulse of the input data, a binary ASK modulated wave with good on/off ratio will be outputted at the modulated wave output terminal 65.

In the present embodiment, the power supplied from the driving circuit 2 is supplied to the field effect transistor 61 or an amplitude modulator through the high frequency choke coil 63. The high frequency choke coil 63 is provided to prevent the carrier from being flowing into the power supply.

The concrete configuration of the ASK modulation apparatus will be explained below.

FIG. 9 shows the circuit diagram of the ASK modulation apparatus.

The ASK modulation apparatus uses the above mentioned 4-stage circuit in the band limiting circuit 1, the buffer amplifier of FIG. 7 in the driving circuit 2, and the high frequency amplifier circuit of Fi. 8 in the ASK modulating circuit 3.

As seen from FIG. 9, the band limiting circuit 1 comprises only a simple passive part, not using a complex active part such as a digital filter that is often used in a frequency band limiting circuit.

Operation of this ASK modulation apparatus will be explained below. FIG. 10 shows the signal waveform of each part of the block diagram of FIG. 9.

First, in FIG. 10, the baseband signal (digital signal) is applied to the baseband signal input terminal 25 of the band limiting circuit 1. This baseband signal is frequency limited by the band limiting circuit 1. The waveform of the output signal smoothly rises and falls against the time axis, as shown in FIG. 10. The output signal from the band limiting circuit 1 is applied to the driving circuit 2.

As the driving circuit 2 functions as a buffer amplifier with the voltage gain 1 between the band limiting circuit 1 and ASK modulating circuit 3, the output voltage waveform is equal to the output voltage waveform of the band limiting circuit 1. The output signal of the driving circuit 2 is applied to the ASK modulating circuit 3. For the description simplicity, the shift equivalent to the voltage drop between the base and emitter of the transistor is omitted.

The ASK modulating circuit 3 turns on/off the field effect transistor by the output signal voltage from the driving circuit 2, thereby turning off the carrier of the externally entered microwave band and performing ASK modulation (binary ASK) and generating the desired ASK modulated wave 84 at the modulated wave output terminal 65.

That is, in the normal operating state with the power supplied, the ASK modulating circuit 3 amplifies the carrier entered according to the supply voltage, and does not output the carrier in the power interrupted state. Therefore, by turning on/off the power supply, it can output a binary ASK modulated wave with good on/off ratio.

The ASK modulating circuit will be explained in detail. Let's assume that the ASK modulating circuit 3 is a linear modulator. An envelope of the ASK modulated wave becomes to be similar to the output waveform of the band limiting circuit 1. A spectrum of the modulating signal will appear on both side bands of the modulated wave spectrum.

Therefore, by decreasing the higher harmonic component included in the input rectangular pulse in the band limiting circuit 1, the occupied bandwidth and adjacent channel leak power of the output modulated wave can be decreased.

Even if the amplitude modulation circuit performs nonlinear operation displaced a little from liner operation, the higher component of the modulated wave side band can be decreased by reducing the higher harmonic component included in the input rectangular pulse in the band limiting circuit 1, and the occupied bandwidth and adjacent channel leak power can also be decreased.

The modulation characteristic of the ASK modulation apparatus of the present embodiment (the number N of stages of the band limiting circuit 1=4, the circuit constant 1 kΩ, C=50 pF, L=50 μH) is compared with those when the band limiting circuit is not used and when the primary integration circuit is provided, by using the modulation characteristic shown in FIG. 11.

In FIG. 11, a reference numeral 93 designates the modulation characteristic when the band limiting circuit 1 of the present invention is used, 92 designates the modulation characteristic when the primary integration circuit of R/C is used, and 91 designates the modulation characteristic when no band limiting circuit is used.

In these modulation characteristics, the 99% occupied bandwidth and 10 MHz separated adjacent channel power are also compared. The modulation speed of the base band signal is 2 Mbps, and the carrier frequency is 6 GHz.

According to the characteristics shown in FIG. 11, the 99% occupied bandwidth is 13 MHzp-p when no band limiting circuit is used, while 11 MHzp-p when the RC circuit is used as a band limiting circuit. With the ASK modulation apparatus of the present invention, the 99% occupied bandwidth is 7 MHzp-p satisfying 8 MHzp-p or lower requirement.

As to the adjacent channel leak power separated 10 MHz from the central frequency, the D/U ratio is 35 dB when no band limiting circuit is used, while 38 dB when the primary integration circuit is used as a band limiting circuit. With the ASK modulation apparatus of the present invention, the D/U ratio is 45 dB improving 7 dB compared with the primary integration circuit. This will satisfy the above-mentioned required D/U ratio of 40 dB or higher.

As to the ASK modulation apparatus of the configuration that is not shown in FIG. 11 but shown in FIG. 9, the on/off ratio is 30 dB saving a margin of 10 dB for the required 20 dB.

It is seen from the above result that the ASK modulation apparatus of the present invention satisfies all required modulation characteristics while only the characteristic shown in FIG. 20 is satisfied with the ASK modulation apparatus in which only the primary integration circuit is provided.

Therefore, the ASK modulation apparatus of the present invention satisfies all conditions including adjacent channel leak power and 99% occupied bandwidth and provides good on/off ratio in a mobile terminal required to be compact and power-saving.

A second embodiment of the present invention will be described below.

FIG. 12 shows a circuit diagram of the second embodiment.

In the second embodiment, the driving circuit 2 of the first embodiment is omitted. The second embodiment can be configured when sufficient driving current is available in a base band signal source to drive the ASK modulating circuit 3 in a later stage. It is more desirable to use the drive circuit 2 or a buffer amplifier in view of stable operation of the circuit in the previous stage.

A third embodiment of the present invention will be described below.

FIG. 13 shows a circuit diagram of the driving circuit 2 in the third embodiment.

In the third embodiment, the driving circuit 2 uses an operational amplifier 121 as a voltage follower with input 122. It is necessary to set the take-in and discharge current of the output terminal 123 large enough to drive the ASK modulator 3 in the later stage, but the input impedance is high and the output impedance is low, and the circuit is an ideal buffer amplifier with linear characteristic.

FIG. 14 shows a circuit diagram of the driving circuit 2 in the fourth embodiment.

In the fourth embodiment, the driving circuit 2 adds resistors 131/132 and diodes 133/134 to the driving circuit 2 in the first embodiment, to improve the input/output linearity.

The diodes 131/132 are biased by the power supply 135 through the resistors 131/132 to cancel voltage drop between the emitter and base of each transistor 51/52.

The voltage drop between the emitter and base is omitted for the description simplicity in the first embodiment. But, actually, this voltage drop causes a switching distortion when the input potential is close to the middle of the supply voltage.

With the configuration shown in FIG. 14, this distortion does not occur and ideal linear input/output characteristic can be obtained.

A fifth embodiment of the present invention will be described below.

FIG. 15 shows a circuit diagram of the driving circuit 2 in the fifth embodiment.

In the fifth embodiment, the operational amplifier 121 is combined with a current amplifier. That is, the third and fourth embodiments are combined.

With the configuration of the fifth embodiment, as the switching distortion of transistors 51/52 is improved by feedback. Further, the input impedance is high, a large current is taken in and discharged in the output side, and this circuit can also be effectively operated as a power supply in the later stage.

A sixth embodiment of the present invention will be described below.

FIG. 16 shows a circuit diagram of the ASK modulation circuit 3 in the sixth embodiment. A reference numeral 200 designates a capacitor, a reference numeral 201 designates a resistor and a reference numeral 202 designates a terminal to supply gate bias.

The ASK modulating circuit 3 of the sixth embodiment employs multiple stages of high frequency amplifier to turn of to improve the on/off ratio. The modulation wave on/off ration can also be improved by increasing the number of high frequency amplifier stages. Actually, in view of cost and mounting space, 1 to 3 stages are desirable.

A seventh embodiment of the present invention will be described below.

FIG. 17 shows a circuit diagram of the ASK modulating circuit 3 in the seventh embodiment.

In the seventh embodiment, a bipolar transistor 300 is used instead of a field effect transistor.

A typical configuration has been explained in the sixth and seventh embodiments, but it is possible to combine a field effect transistor with a bipolar transistor as a configuration of the ASK modulating circuit 3. It is also possible to use an IC amplifier available on the market. In any case, it is desirable to set ASK of the output modulation wave to be proportional to the supply voltage, that is, as a linear modulator.

The ASK modulation apparatus of the present invention uses a band limiting circuit comprising a passive circuit to shape the discontinuous part of a step like changing digital signal waveform so that inclination of a response output becomes zero, and the output signal is used to turn on/off the power supply to the high frequency amplifier thereby providing good binary ASK modulated wave.

The band limiting circuit of the ASK modulation apparatus of the present invention comprises only passive parts such as a resistor, a coil and a capacitor. This is effective for lower power consumption and compact circuit.

Further, as a whole ASK modulation apparatus, the size is much compact and the power consumption is much less than an ASK modulation apparatus using a digital filter in the band limiting circuit.

For example, the ASK modulation apparatus of the present invention can be mounted in a space of 30 mm square if it is mounted on a PC board. If a digital filter is used to compose an ASK modulating circuit of the equivalent performance, the required mounting space will be 5–10 times larger.

Therefore, as the ASK modulation circuit of the present invention does not use a digital filter as a band limiting means, power supply and synchronous clock supply are unnecessary, and optimum as a mobile terminal demanded to be compact and low power consumption.

Further, the band limiting circuit of the present invention has input impedance that is constant over all frequencies and consists only of resistance element. This makes it difficult to occur unnecessary wave disturbance such as ripple due to reflection of base band signal, ringing of signal and overshoot. This suppresses spreading of band in frequency area by the unnecessary component produced by the wave disturbance, and reduces the unnecessary component such as leakage to adjacent channel.

What is claimed is:

1. An Amplitude Shift Keying (ASK) modulation apparatus which modulates a rectangular high speed data signal within a microwave band, said apparatus comprising:
   a band limiter for waveform shaping to eliminate an inclination of an output waveform at a rising of data signal by using a passive element, said band limiter having an input impedance that is constant independent of frequency; and
   an ASK modulating circuit for inputting a carrier wave of a microwave band and ASK-modulating said carrier wave by turning off the drive voltage of a high frequency amplifier based on the output of said band limiter.

2. The ASK modulation apparatus of claim 1, further comprising:
   a driver having a buffer amplifier for driving said high frequency amplifier, said driver being connected to the output of said band limiter.

3. An Amplitude Shift Keying (ASK) modulation apparatus which modulates a rectangular high speed data signal within a microwave band, said apparatus comprising:
   a band limiter for waveform shaping to eliminate an inclination of an output waveform at a rising of data signal by using a passive element; and
   an ASK modulating circuit for inputting a carrier wave of a microwave band and ASK-modulating said carrier wave by turning off the drive voltage of a high frequency amplifier based on the output of said band limiter,
   wherein said band limiter comprises N stages (N is an integer greater than 2) of a basic circuit, said N stages connected in cascade and receiving a data signal input, said band limiter further comprising a grounded resistor R connected to an output of the Nth stage of said basic circuits,
   wherein each said basic circuit comprises:
      a coil L provided between an input of said basic circuit and an output of said basic circuit; and
      second end a serial circuit having a first end thereof connected to an input of said coil L and a second end thereof connected to ground, said serial circuit having a resistor R serially-interconnected to a capacitor C.

4. The ASK modulation apparatus of claim 3, wherein said basic circuit is composed to satisfy $L=CR^2$.

5. The ASK modulation apparatus of claim 3, wherein the number N and a circuit constant of said basic circuit depend on a time response of said data signal.

6. The ASK modulation apparatus of claim 3, wherein the number N and a circuit constant of said basic circuit depend on a rise time of a rectangular wave of the data signal, an out-band unnecessary higher harmonic component, and a suppression of an adjacent carrier component of ASK modulating wave.

7. The ASK modulation apparatus of claim 2, wherein said buffer amplifier comprises two transistors combined in an emitter-follower type.

8. The ASK modulation apparatus of claim 2, wherein said buffer amplifier comprises an operational amplifier.

9. The ASK modulation apparatus of claim 2, wherein said buffer amplifier comprises an operational amplifier and a current amplifier.

10. The ASK modulation apparatus of claim 1, wherein said high frequency amplifier comprises a field effect transistor connected to M stages (M is an integer greater than 1).

11. The ASK modulation apparatus of claim 1, wherein said high frequency amplifier comprises a bipolar transistor amplifier connected to M stages (M is an integer greater than 1).

12. An Amplitude Shift Keying (ASK) modulation apparatus which modulates a rectangular high speed data signal within a microwave band, said ASK modulation apparatus comprising:
   a band limiting circuit having four basic circuits connected in cascaded stages to an input of said data signal, each said basic circuit comprising:
      a coil L connected between an input of said basic circuit and an output of said basic circuit; and
      a serial circuit having one end connected to an input of said coil L and a second end connected to ground, said serial circuit comprising a resistor R serially-interconnected to a capacitor C;
   a grounded resistor R connected to an output of the $4^{th}$ stage of said basic circuits; and
   an ASK modulator for inputting a carrier wave of a microwave band and ASK-modulating said carrier wave by turning off a drive voltage of a high frequency amplifier based on the output of said band limiting circuit.

13. The ASK modulation apparatus of claim 12, further comprising a buffer amplifier for driving said high frequency amplifier.

14. An Amplitude Shift Keying (ASK) modulation apparatus which modulates a rectangular high speed data signal within a microwave band, said ASK modulation apparatus comprising:
   a band limiting circuit having four basic circuits that are connected in cascaded stages to an input of said data signal, each said basic circuit comprising:
      a coil L connected between an input of said basic circuit and output of said basic circuit; and
      a serial circuit being one end connected to an input of said coil L and other end connected to ground, said serial circuit comprising a resistor R serially-interconnected to a capacitor C;
   a grounded resistor R connected to the output of the $4^{th}$ stage of said basic circuits;
   a buffer amplifier having a first transistor and a second transistor connected to said band limiting circuit and combined in an emitter-follower type; and
   a high frequency amplifier circuit comprising a field effect transistor (FET), an output of said buffer amplifier being connected to a drain of said FET, a source of said FET being grounded, and a carrier of the microwave band being connected to a gate of said FET.

15. An Amplitude Shift Keying (ASK) modulation apparatus which modulates a rectangular high speed data signal within a microwave band, said ASK modulation apparatus comprising:
   a band limiting circuit having four basic circuits that are connected in cascaded stages to an input of said data signal, each said basic circuit comprising:
      a coil L connected between an input of said basic circuit and an output of said basic circuit; and
      a serial circuit having a first end connected to an input of said coil L and a second end connected to ground, said serial circuit comprising a resistor R serially-connected to a capacitor C;
   a grounded resistor R connected to the output of the $4^{th}$ stage of said basic circuits;
   a buffer amplifier comprising an operational amplifier connected to said band limiting circuit and a current amplifier connected to an output of the operational amplifier; and
   a high frequency amplifier circuit comprising a field effect transistor, wherein a source of said FET is grounded, an output of said buffer amplifier connects to a drain of said FET, and a carrier of the microwave band connects to a gate of said FET.

16. An Amplitude Shift Keying (ASK) modulation method which modulates a rectangular high speed data signal within a microwave band, said method comprising:
   band limiting for waveform shaping to eliminate an inclination of an output waveform at a rising of said data signal by using a passive element, a circuit for said band limiting having an input impedance that is constant independent of frequency;
   inputting a carrier wave of a microwave band; and
   ASK-modulating said carrier wave by turning off a drive voltage of a high frequency amplifier, as based on a signal shaped by said band limiting.

17. An Amplitude Shift Keying (ASK) modulation method which modulates a rectangular high speed data signal within a microwave band, said method comprising:
   band limiting for waveform shaping to eliminate an inclination of an output waveform at rising of said data signal by using a passive element;
   inputting a carrier wave of a microwave band; and
   ASK-modulating said carrier wave by turning off a drive voltage of a high frequency amplifier based on a signal shaped by said band limiting,
   wherein said band limiting is characterized by N stages (N is an integer greater than 2) of basic circuits connected to an input of said data signal, each said basic circuit comprising:
      a coil L connected between an input of said basic circuit and an output of said basic circuit; and
      a serial circuit having a first end connected to an input of said coil L and a second end connected to ground, said serial circuit comprising a resistor R serially-interconnected to a capacitor C, and a grounded resistor R is connected to an output of the Nth stage of said basic circuits.

18. The ASK modulation method of claim 17, wherein the number N of stages and a circuit constant of said basic circuit is determined by:
   calculating an output response, assuming a time constant T as a parameter when N=2 and L/R=T;
   first determining whether said output response satisfies a given D/U ratio and occupied bandwidth, said D/U ratio being a maximum power of a non-modulated carrier power to a leak power to an adjacent channel;

second determining whether said output response satisfies rises within a minimum pulse width when a rectangular pulse is an input;

setting the number N of stages and the circuit constant if said first determining and said second determining are both satisfied; and increasing N and repeating said first determining and said second determining if one of said first determining and said second determining is not satisfied.

19. The ASK modulation method of claim 17, wherein the number N of stages and a circuit constant of said basic circuit is determined by:

calculating an output response, assuming a time constant T as a parameter when N=2 and L/R=T, first determining whether said output response satisfies a given D/U ratio, said D/U ratio being a maximum power of a non-modulated carrier power to a leak power to an adjacent channel, second determining whether said output response satisfies rises within a minimum pulse width when a rectangular pulse is an input;

setting the number N of stages and the circuit constant if said first determining and said second determining are both satisfied; and increasing N and repeating said first determining and said second determining if one of said first determining and said second determining is not satisfied.

20. The ASK modulation method of claim 17, wherein the number N of stages and the circuit constant of said basic circuit is decided by:

calculating an output response assuming a time constant T as a parameter when N=2 and L/R=T;

first determining whether said output response satisfies a given occupied bandwidth;

second determining whether said output response satisfies rises within a minimum pulse width when a rectangular pulse is an input, setting the number N of stages and the circuit constant if said first determining and said second determining are both satisfied; and increasing N and repeating said first determining and said second determining if one of said first determining and said second determining is not satisfied.

21. A band limiter for a modulation circuit, said band limiter comprising:

a band limiter input terminal;

a band limiter output terminal;

an output resistor having a resistance value R, said resistor having a first terminal connected to said band limiter output terminal, said resistor having a second terminal connected to ground; and at least two basic block circuits serially interconnected between said band limiter input terminal and said band limiter output terminal, each said basic block circuit comprising:

a block resistor with a resistance value R;

a capacitor with capacitance value C, an inductor with inductance value L;

a block circuit input terminal; and a block circuit output terminal, wherein, in each said basic block circuit, said capacitor and said block resistor are serially-interconnected and a first terminal of said inductor and a first terminal of said serially-interconnected block resistor and capacitor are connected to said block circuit input terminal, a second terminal of said inductor is connected to said block output terminal, a second terminal of said serially-interconnected block resistor and capacitor is connected to ground, said values L, C, and R satisfy the equation $L=CR^2$, a block circuit input terminal of a first of said at least two basic block circuits is connected to said band limiter input terminal, a block circuit output terminal of a final of said at least two basic block circuits is connected to said band limiter output terminal, and a block circuit output terminal of each said basic block circuit is connected to a block circuit input terminal of a succeeding basic block circuit.

22. An Amplitude Shift Keying (ASK) modulation apparatus, comprising:

a band limiting circuit having a plurality of basic circuits that are connected in cascade to a data signal input terminal, each said basic circuit comprising:

a coil L connected between an input terminal of said basic circuit and an output terminal of said basic circuit; and a serial circuit having a first end connected to said input terminal of said basic circuit and a second end connected to ground, said serial circuit comprising a resistor R serially-interconnected to a capacitor C; and a ground resistor R connected to the output terminal of a final stage of said cascaded basic circuits.

23. An Amplitude Shift Keying (ASK) modulation apparatus which modulates a rectangular high speed data signal within a microwave band, said apparatus comprising:

a band limiter for receiving said data signal and shaping an output wave thereof such that said output waveform satisfies the following formula with respect to a time axis, where t represents time, Vout(t) represents an output voltage at time t, $$\frac{\Delta V_{out}(t)}{\Delta t|_{t \to 0}} = 0,$$

said band limiter comprising passive elements and having a constant input impedance independent of the frequency of said data signal; and an ASK modulator for receiving a carrier wave in the microwave band, intermittently connecting a drive voltage for a high-frequency amplifier based on an output of said band limiter, and ASK-modulating said carrier wave.

* * * * *